United States Patent
Ellis-Monaghan et al.

(10) Patent No.: US 7,531,392 B2
(45) Date of Patent: May 12, 2009

(54) MULTI-ORIENTATION SEMICONDUCTOR-ON-INSULATOR (SOI) SUBSTRATE, AND METHOD OF FABRICATING SAME

(75) Inventors: John J. Ellis-Monaghan, Grand Isle, VT (US); Mark D. Jaffe, Shelburne, VT (US)

(73) Assignee: International Business Machines Corporation, Armonk, NY (US)

(*) Notice: Subject to any disclaimer, the term of this patent is extended or adjusted under 35 U.S.C. 154(b) by 511 days.

(21) Appl. No.: 11/276,366

(22) Filed: Feb. 27, 2006

(65) Prior Publication Data

US 2007/0202635 A1 Aug. 30, 2007

(51) Int. Cl.
*H01L 21/84* (2006.01)

(52) U.S. Cl. .............. 438/150; 438/197; 438/198; 438/199; 438/200; 438/222; 257/E21.567; 257/E21.633; 257/E21.642; 257/E21.703; 257/E27.112; 257/E29.004; 257/E29.056; 257/E29.286; 257/E29.297

(58) Field of Classification Search ......... 438/197–200, 438/222; 257/E21.567, 633, 703, E27.112, 257/E29.004, 56, 256, 297
See application file for complete search history.

(56) References Cited

U.S. PATENT DOCUMENTS

| | | | |
|---|---|---|---|
| 6,815,278 B1 * | 11/2004 | Ieong et al. | 438/198 |
| 6,830,962 B1 | 12/2004 | Guarini et al. | |
| 6,870,226 B2 | 3/2005 | Maeda et al. | |
| 6,864,534 B2 | 8/2005 | Ipposhi et al. | |
| 7,385,257 B2 * | 6/2008 | Ieong et al. | 257/369 |
| 7,439,109 B2 * | 10/2008 | Anderson et al. | 438/150 |
| 7,439,110 B2 * | 10/2008 | Cheng et al. | 438/150 |
| 7,439,542 B2 * | 10/2008 | Yang | 257/64 |
| 7,465,992 B2 * | 12/2008 | Desouza et al. | 257/351 |
| 2004/0161904 A1 | 8/2004 | Berne et al. | |
| 2004/0166649 A1 | 8/2004 | Bressot et al. | |
| 2004/0171232 A1 | 9/2004 | Cayrefourcq et al. | |
| 2004/0178406 A1 * | 9/2004 | Chu | 257/19 |
| 2004/0195646 A1 | 10/2004 | Yeo et al. | |
| 2004/0256700 A1 | 12/2004 | Doris et al. | |
| 2004/0266128 A1 | 12/2004 | Chen et al. | |
| 2005/0116290 A1 * | 6/2005 | de Souza et al. | 257/347 |
| 2006/0105507 A1 * | 5/2006 | Ieong et al. | 438/149 |
| 2006/0194421 A1 * | 8/2006 | Ieong et al. | 438/510 |
| 2006/0275961 A1 * | 12/2006 | Chan et al. | 438/150 |
| 2007/0063278 A1 * | 3/2007 | Doris et al. | 257/347 |

FOREIGN PATENT DOCUMENTS

| | | |
|---|---|---|
| JP | 2106034 A | 4/1990 |
| JP | 11017001 A | 4/1999 |

* cited by examiner

*Primary Examiner*—Michael S Lebentritt
(74) *Attorney, Agent, or Firm*—Scully, Scott, Murphy & Presser, P.C.; Riyon Harding

(57) ABSTRACT

The present invention relates to semiconductor-on-insulator (SOI) substrate structures that contain surface semiconductor regions of different crystal orientations located directly on an insulator layer. The present invention also relates to methods for fabricating such SOI substrate structures, by growing an insulator layer directly on a multi-orientation bulk semiconductor substrate that comprises surface semiconductor regions of different crystal orientations located directly on a semiconductor base layer, and removing the semiconductor base layer, thereby forming a multi-orientation SOI substrate structure that comprises surface semiconductor regions of different crystal orientations located directly on the insulator layer.

16 Claims, 8 Drawing Sheets

MULTI-ORIENTATION SEMICONDUCTOR-ON-INSULATOR (SOI) SUBSTRATE, AND METHOD OF FABRICATING SAME

FIELD OF THE INVENTION

The present invention relates to multi-orientation semiconductor-on-insulator (SOI) substrate structures that contain surface semiconductor regions of different crystal orientations located directly on an insulator layer, and methods for fabricating such multi-orientation SOI substrate structures.

BACKGROUND OF THE INVENTION

Complementary metal oxide semiconductor (CMOS) circuits of current semiconductor technology comprise n-type field effect transistors (nFETs), which utilize electron carriers for their operation, and p-type field effect transistors (pFETs), which utilize hole carriers for their operation. CMOS circuits are typically fabricated on semiconductor wafers having a single crystal orientation. In particular, most of today's semiconductor devices are built on Si wafers having a (100) crystal orientation.

It is known that electrons have a high mobility in Si with a (100) crystal orientation and that holes have high mobility in Si with a (110) crystal orientation. In fact, hole mobility can be about 2 to 4 times higher in a 110-oriented Si wafer than in a standard 100-oriented Si wafer. It is therefore desirable to create a semiconductor substrate that comprises both 100-oriented Si surface regions, on which nFETs can be formed, and 110-oriented Si surface regions, on which pFETs can be formed. Semiconductor substrates that contain surface Si regions of different crystal orientations are hereby referred to as multi-orientation substrates.

There is a continuing need for improved multi-orientation substrates, especially for multi-orientation substrates that have complete SOI structures. There is also a need for improved methods for fabricating high quality multi-orientation substrates at lower costs with less processing steps.

SUMMARY OF THE INVENTION

The present invention, in one aspect, relates to a method for forming a multi-orientation SOI substrate structure, comprising:

forming a multi-orientation bulk semiconductor substrate comprising at least a first surface semiconductor region having a first crystal orientation and at least a second surface semiconductor region having a second, different crystal orientation, wherein both the first and second surface semiconductor regions are located directly on a semiconductor base layer having either the first or the second crystal orientation;

forming an insulator layer directly over the first and second surface semiconductor regions; and removing the semiconductor base layer from the first and second surface semiconductor regions and the insulator layer to form a multi-orientation SOI substrate structure that comprises the first and second surface semiconductor regions located directly on the insulator layer.

The first and second surface semiconductor regions may comprise any suitable crystalline semiconductor material(s), including but are not limited to: Si, SiC, SiGe, SiGeC, Ge alloys, GaAs, InAs, InP, III-V compound semiconductors, and II-VI compound semiconductors. Preferably, the first and second surface semiconductor regions comprise silicon or a silicon-containing semiconductor material, and the first and second crystal orientations are selected from the group consisting of (100), (111), and (110).

Preferably, but not necessarily, the insulator layer comprises a thermally grown insulator material selected from the group consisting of silicon oxide, silicon nitride, and silicon oxynitride.

In one specific embodiment of the present invention, the multi-orientation semiconductor substrate is formed by:

forming a layered semiconductor structure that comprises a first, upper semiconductor layer having one of the first and the second crystal orientations and a second, lower semiconductor layer having the other of the first and the second crystal orientations;

selectively removing a portion of the first, upper semiconductor layer to form at least one recess that exposes an upper surface of the second, lower semiconductor layer;

growing a semiconductor material in the at least one recess and over at least one un-removed portion of the first, upper semiconductor layer to form at least a first semiconductor structure that has the same crystal orientation as the second, lower semiconductor layer and at least a second semiconductor structure that has the same crystal orientation as the first, upper semiconductor layer; and planarizing the first and second semiconductor structures.

The layered semiconductor structure as described hereinabove is preferably formed by wafer bonding techniques.

In an alternative embodiment of the present invention, the multi-orientation semiconductor substrate is formed by:

forming a layered semiconductor structure that comprises a first, upper semiconductor layer having one of the first and the second crystal orientations and a second, lower semiconductor layer having the other of the first and the second crystal orientations; and selectively converting a portion of the first, upper semiconductor layer to form at least a first semiconductor structure that has the same crystal orientation as the second, lower semiconductor layer, wherein at least one unconverted portion of the first, upper semiconductor layer form at least a second semiconductor structure that has the same crystal orientation as the first, upper semiconductor layer.

Preferably, trenches that extend through the first, upper semiconductor layer into the second, lower semiconductor layer are formed before the selective conversion in such a manner that the first semiconductor structure is isolated from the second semiconductor structure by such trenches after the conversion. Further, the selective conversion is preferably, but not necessarily, carried out by selective or localized amorphization and recrystallization.

Removal of the semiconductor base layer is preferably achieved in the present invention by:

implanting at least one defect-inducing agent near an interface between the semiconductor base layer and the first and second surface semiconductor regions to form a zone weakened by the presence of defects; and splitting in the weakened zone so as to detach the semiconductor base layer from the first and second surface semiconductor regions and the insulator layer.

The defect-inducing agent can be selected from the group consisting of hydrogen, helium, argon and other noble gases. Preferably, the defect-inducing agent comprise hydrogen and is implanted at a dose of not less than $1\times10^{16}$ atoms/cm$^2$, more preferably not less than $5\times10^{16}$ atoms/cm$^2$, and most preferably not less than $1\times10^{17}$ atoms/cm$^2$.

Either before or after the semiconductor base layer is removed, a substitute semiconductor base structure may be provided and bonded to a surface of the insulator layer opposite to the surface that contacts the first and second surface semiconductor regions. Such a substitute semiconductor base structure provides support to the multi-orientation SOI substrate structure.

Further, the first and second surface regions can be planarized to from a planar surface for subsequent fabrication of device structures thereon after the semiconductor base layer is removed.

In another aspect, the present invention relates to a method comprising growing an insulator layer directly on a multi-orientation bulk semiconductor substrate that comprises surface semiconductor regions of different crystal orientations located directly on a semiconductor base layer, and removing the semiconductor base layer, thereby forming a multi-orientation SOI substrate structure that comprises surface semiconductor regions of different crystal orientations located directly on the insulator layer.

A further aspect of the present invention relates to a semiconductor substrate structure that comprises:

a semiconductor base substrate, a thermally grown insulator layer located directly on the semiconductor base substrate, wherein the thermally grown insulator layer comprises an insulator material selected from silicon oxide, silicon nitride, silicon oxynitride, and combinations thereof; and a semiconductor surface layer located directly on the thermally grown insulator layer, wherein the semiconductor surface layer comprises surface semiconductor regions of different crystal orientations.

Thermally grown insulator layers are typically characterized by less defects, lower interface state density and more uniform thickness in comparison with insulator layers formed by other techniques, such as ion implantation.

Other aspects, features and advantages of the invention will be more fully apparent from the ensuing disclosure and appended claims.

DETAILED DESCRIPTION OF THE INVENTION, AND PREFERRED EMBODIMENTS THEREOF

Figure 1A:
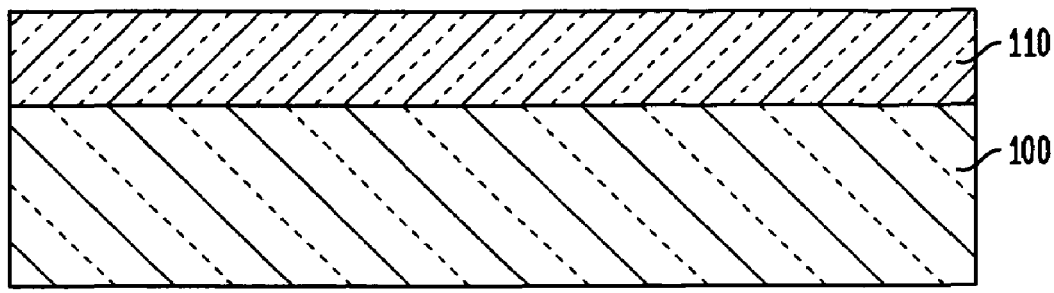
FIGS. 1A-1H show cross sectional views that illustrate the processing steps of an exemplary method for forming a multi-orientation SOI substrate structure, according to one embodiment of the present invention.

The following U.S. Patent Application Publications are incorporated herein by reference in their entireties for all purposes:

U.S. Patent Application Publication No. 2004/0256700 as published on Dec. 23, 2004 for "HIGH-PERFORMANCE CMOS DEVICES ON HYBRID CRYSTAL ORIENTED SUBSTRATES"; and U.S. Patent Application Publication No. 2005/0116290 as published on Jun. 2, 2005 for "PLANAR SUBSTRATE WITH SELECTED SEMICONDUCTOR CRYSTAL ORIENTATIONS FORMED BY LOCALIZED AMORPHIZATION AND RECRYSTALLIZATION OF STACKED TEMPLATE LAYERS."

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on or over the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

U.S. Patent Application Publication No. 2004/0256700 published on Dec. 23, 2004 for "HIGH-PERFORMANCE CMOS DEVICES ON HYBRID CRYSTAL ORIENTED SUBSTRATES" describes a multi-orientation, or hybrid-orientation, semiconductor substrate that contains a first set of Si surface regions of a first crystal orientation located on SOI substrates and a second set of Si surface regions of a second, different crystal orientation located on bulk substrates. The multi-orientation semiconductor substrate described by U.S. Patent Application Publication No. 2004/0256700 is therefore only a partial SOI substrate structure, i.e., it contains Si surface regions that are located on bulk semiconductor substrates, instead of on SOI substrates. Because device structures built on bulk semiconductor substrates are characterized by significantly higher junction capacitance than device structures built on SOI substrates, the partial SOI substrate structures described by U.S. Patent Application Publication No. 2004/0256700 have relatively limited performance improvement.

The present invention provides an improved multi-orientation semiconductor substrate that contains surface semiconductor regions of different crystal orientations, while all of the surface semiconductor regions are located directly on a common insulator layer. The improved multi-orientation semiconductor substrate of the present invention is therefore a complete semiconductor-on-insulator (SOI) substrate structure, which has significantly reduced junction capacitance in comparison with partial SOI multi-orientation substrate structures that still contain certain bulk semiconductor regions. Device structures, such as field effect transistors (FETs), resistors, diodes, capacitors, etc., that are fabricated on such a multi-orientation complete SOI substrate structure have significantly improved performance in comparison with those fabricated on the multi-orientation partial SOI substrates as all types of FETs are formed on SOI as opposed to only one of the FET types (e.g. NFETs formed on SOI and PFETs formed on bulk).

The present invention further provides methods for fabricating the improved multi-orientation SOI semiconductor substrate as described hereinabove. The inventive methods preferably involve the steps of forming a multi-orientation bulk semiconductor substrate having surface semiconductor regions of different crystal orientation located directly on a semiconductor base layer, forming an insulating layer over the surface semiconductor regions, and removing the semiconductor base layer. Specifically, the multi-orientation bulk semiconductor substrate can be formed by one or more processing steps including, but not limited to: wafer bonding, selective etching, epitaxial regrowth, trench etching, selective or localized amorphization and recrystallization, planarization, etc. The semiconductor base layer can be removed by one or more processing steps including, but not limited to: implantation of defect-inducing agent(s), wafer splitting, laser lift-off, wet etching, etc.

Such methods, as well as the resulting multi-orientation SOI semiconductor substrates, will now be described in greater detail by referring to the accompanying FIGS. 1A-3G. Note that in these drawings, which are not drawn to scale, like and/or corresponding elements are referred to by like reference numerals. It is further noted that in the drawings, only one surface semiconductor region of a first crystal orientation and two surface semiconductor regions of a second, different crystal orientation are shown. Although illustration is made to such an embodiment, the present invention is not limited to formation of any specific number of surface semiconductor regions and any specific number of different crystal orientations.

Reference is first made to FIG. 1A, which shows a bilayer semiconductor structure that contains a first, upper semiconductor layer 110 of a first crystal orientation and a second, lower semiconductor layer 100 of a second crystal orientation that is different from the first crystal orientation. The bilayer semiconductor structure can be readily formed by wafer bonding techniques as described by U.S. Patent Application Publication No. 2004/0256700 and U.S. Patent Application Publication No. 2005/0116290, the contents of which are incorporated herein by reference in their entireties.

The first and second semiconductor layers 110 and 100 may comprise any semiconductor material, including, but not limited to: Si, SiC, SiGe, SiGeC, Ge alloys, GaAs, InAs, InP, as well as other III-V or II-VI compound semiconductors. Each of the first and second semiconductor layers 110 and 100 may comprise a doped or undoped bulk semiconductor wafer, a bulk semiconductor wafer containing a pre-formed ion implanted region, such as an $H_2$ and/or He implant region that can be used to split a portion of such wafer, or a layered semiconductor bulk structure such as, for example, Si/SiGe. In one preferred embodiment, both the first and second semiconductor layers 110 and 100 comprise silicon or a Si-containing semiconductor material. More preferably, the first, upper semiconductor layer 110 comprises silicon with a (110) crystal orientation, and the second, lower semiconductor layer 100 comprises silicon with a (100) crystal orientation, or vice versa.

The thickness of the first, upper semiconductor layer 110 may vary depending on the initial starting wafer used to form layer 110. Preferably, the first, upper semiconductor layer 110 has an initial thickness from about 5 to about 100 nm, which can be subsequently thinned to a thickness of 40 nm or less by subsequent planarization, grinding, wet etching, dry etching, or any combination thereof. More preferably, the first, upper semiconductor layer 110 is thinned by oxidation and wet etching to achieve the desired thickness suitable for functioning as a thin semiconductor layer in the multi-orientation SOI substrate structure to be formed.

The thickness of the second, lower semiconductor layer 100 may also vary, depending on the initial starting wafers used to form the substrate. Preferably, the lower semiconductor layer has a thickness from about 5 nm to about 200 nm, and more preferably from about 5 to about 100 nm.

Figure 1B:
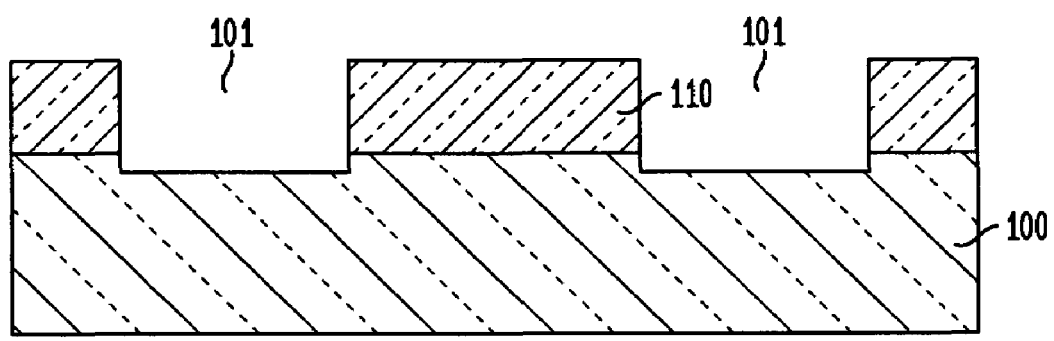

FIG. 1B shows formation of one or more recesses 101 that extend through the first, upper semiconductor layer 110 and expose an upper surface of the second, lower semiconductor layer 100, by selectively removing a portion of layer 110. Preferably, a patterned mask (not shown) is formed on a predetermined region of the first, upper semiconductor layer 110 by photolithography and etching so as to define at least one protected region and at least one unprotected region on the surface of the first, upper semiconductor layer 110. The patterned mask allows selectively etching at the unprotected region so as to remove a portion of the first, upper semiconductor layer 110 from the unprotected region, thereby forming one or more recesses 101 and exposing an upper surface of the second, lower semiconductor layer 100, as shown in FIG. 1B. The selective etching may be performed utilizing a single etching process or multiple etching steps, including, but not limited to: a dry etching process such as reactive-ion etching, ion beam etching, plasma etching or laser etching, or a wet etching process wherein a chemical etchant is employed or any combination thereof. In a preferred embodiment of the present invention, reactive-ion etching (RIE) is used for selective etching. After etching, the patterned mask is removed from the first, upper semiconductor layer 110 utilizing a conventional resist stripping process.

Figure 1C:
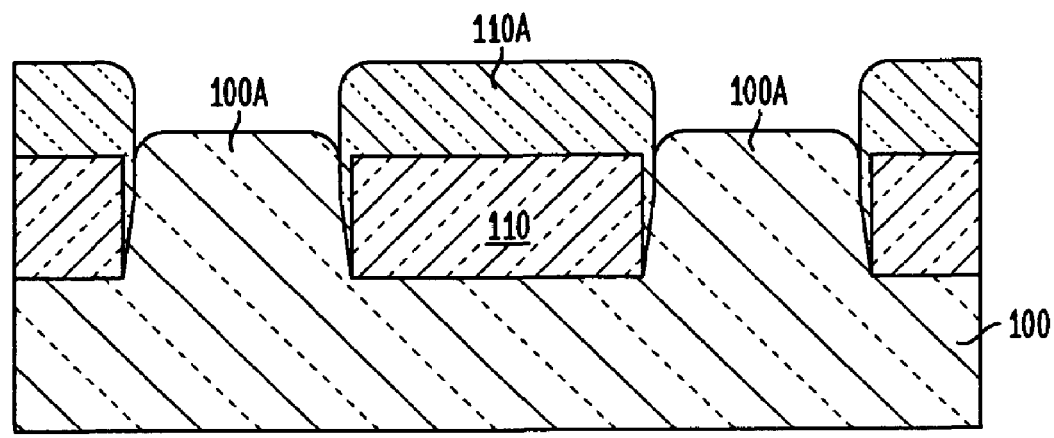

Next, a semiconductor material is epitaxially grown in the recesses 101 on the exposed upper surface of the second, lower semiconductor layer 100 so as to form one or more semiconductor structure 100A that have the same crystal orientation as the second, lower semiconductor layer 100, as shown in FIG. 1C. Concurrently, the semiconductor material is epitaxially grown on at least one un-removed portion of the first, upper semiconductor layer 110 so as to form one or more semiconductor structure 110A that have the same crystal orientation as the first, upper semiconductor layer 110, as shown in FIG. 1C. The semiconductor material may comprise any suitable semiconductor material(s), and it can either the same or different from those contained in the first and second semiconductor layers 110 and 100, as long as the semiconductor material is capable of being grown epitaxially. Preferably, but not necessarily, the semiconductor material comprises silicon or a Si-containing semiconductor, such as Si, strained Si, SiGe, SiC, SiGeC, or combinations thereof.

Figure 1D:
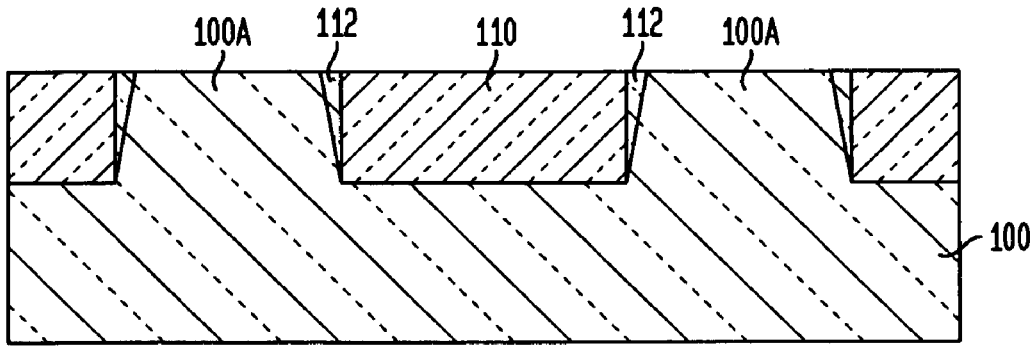

Subsequently, the semiconductor structures 100A and 110A are planarized to remove the semiconductor structure 110A and to expose the un-removed portion of the first, upper semiconductor layer 110, as shown in FIG. 1D. Correspondingly, a multi-orientation bulk semiconductor substrate is formed, which comprises at least a first surface semiconductor region defined by the un-removed portion of the first, upper semiconductor layer 110 having a first crystal orientation and at least a second surface semiconductor region defined by the epitaxially grown semiconductor structure 100A having a second, different crystal orientation. Alternatively, the planarization step of the present invention may remove only an upper portion of the semiconductor structure 110A, and the resulting multi-orientation bulk semiconductor structure will then comprise a first surface semiconductor region defined by the lower, un-removed portion of the semiconductor structure 110A that has a first crystal orientation and a second surface semiconductor region defined by the semiconductor structure 100A that has a second, different crystal orientation.

As shown in FIG. 1D, the first and second semiconductor regions of different crystal orientations, as described hereinabove, are located directly on the second, lower semiconductor layer 100, which functions as a base or support layer. Further, one or more interfacial regions 112, which are formed between the first and second semiconductor regions during the epitaxial growth, can be processed subsequently to form device isolation regions that separates the first and second semiconductor regions.

Figure 1E:
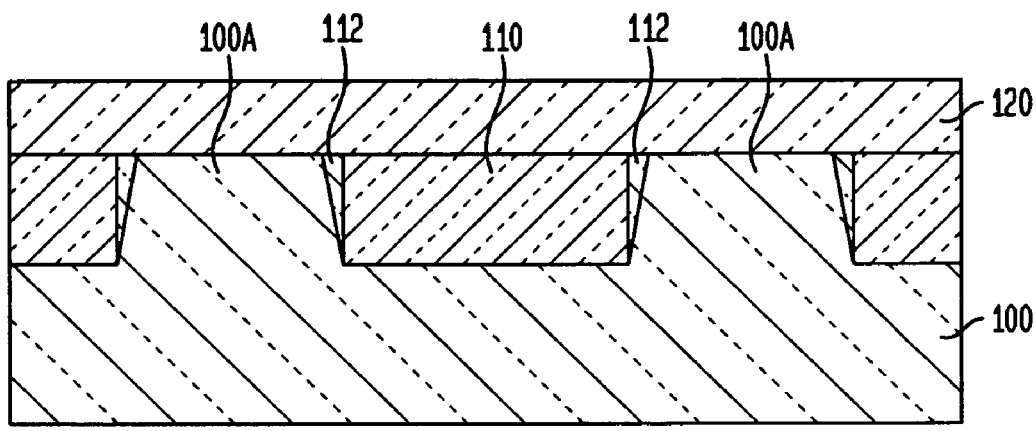

Subsequently, an insulator layer 120 is formed directly on the above-described first and second semiconductor regions, as shown in FIG. 1E. The insulator layer 120 may comprise any suitable insulator material(s), including, but not limited to: silicon oxide, silicon nitride, silicon oxynitride, etc., and the thickness of the insulator 120 may vary widely, depending on the specific applications. Typically, however, the insulating layer 120 has a thickness from about 1 nm to about 500 nm, with a thickness from about 1 nm to about 50 nm being more typical.

The insulator layer 120 may be formed by any suitable process (e.g., thermal growth/deposition, ion implantation, etc.) that involves oxidation, nitridation, or oxynitridation. Preferably, the insulator layer 120 is formed by a thermal growth or deposition process, which typically produces insulator layers of less defects, lower interface state density, and better thickness uniformity, in comparison with insulator layers formed by ion implantation processes.

Figure 1F:
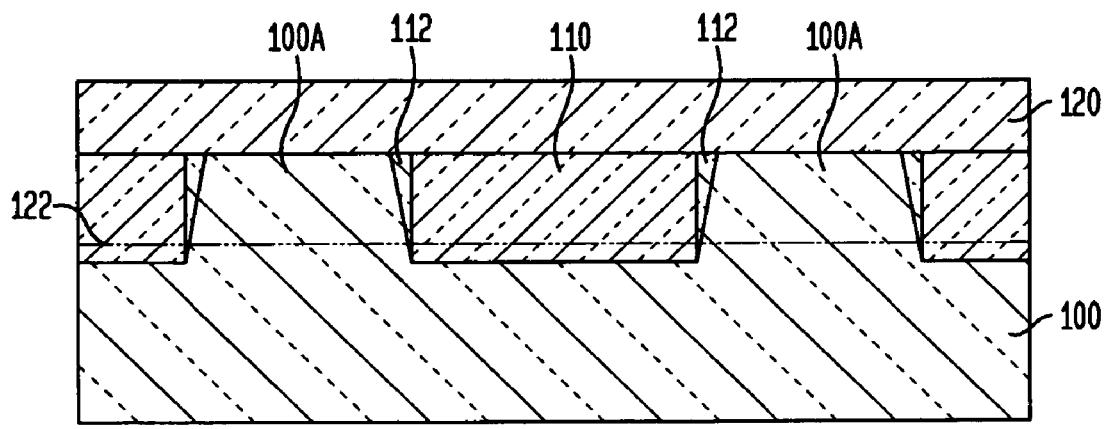

After formation of the insulator layer 120, the second, lower semiconductor layer 100 is removed from underneath the first and second surface semiconductor structures 100A and 110 along a separation line 122 near the interface between layer 100 and the first and second surface semiconductor structures 100A and 110, as shown in FIG. 1F. Preferably, but not necessarily, the separation line 122 is above the interface. Removal of the second, lower semiconductor layer 100 can be achieved by any suitable methods, which include, but are not limited to: implantation of defect-inducing agent(s) such as ionic or gaseous hydrogen and helium, wafer splitting, laser lift-off, wet/dry etching, etc.

In one specific embodiment of the present invention, a pre-formed ion implanted region that contains ionic or gaseous hydrogen and/or helium implants can be provided in the second, semiconductor layer 100 for splitting a portion of layer 100. In an alternative embodiment of the present invention, ionic or gaseous hydrogen and helium can be implanted at the separation line 122 after formation of the insulator layer 120 to form defects that weaken the crystal structure at the separation line 122 and allow the second, lower semiconductor layer 100 to be split off along the separation line 122. Such a technique is typically referred to as the SMART-CUT® process, which is described in greater detail by U.S. Patent Application Publication No. 2004/0161904 published Aug. 19, 2004 for "TWO-STAGE ANNEALING METHOD FOR MANUFACTURING SEMICONDUCTOR SUBSTRATES," U.S. Patent Application Publication No. 2004/0166649 published Aug. 24, 2004 for "LAYER TRANSFER METHOD," and U.S. Patent Application Publication No. 2004/0171232 published Sep. 2, 2004 for "METHOD OF DETACHING A THIN FILM AT MODERATE TEMPERATURE AFRER CO-IMPLANTATION," the contents of which are incorporated herein by reference in their entireties for all purposes.

It is important to note that although the SMART-CUT® process or other implantation-based process is preferably employed in the present invention, other wafer separation and removal techniques that do not involve defect implantation, such as laser lift-off and wet/dry etching, can be readily employed by the present invention for separating and removing the second, lower semiconductor layer 100.

Figure 1G:
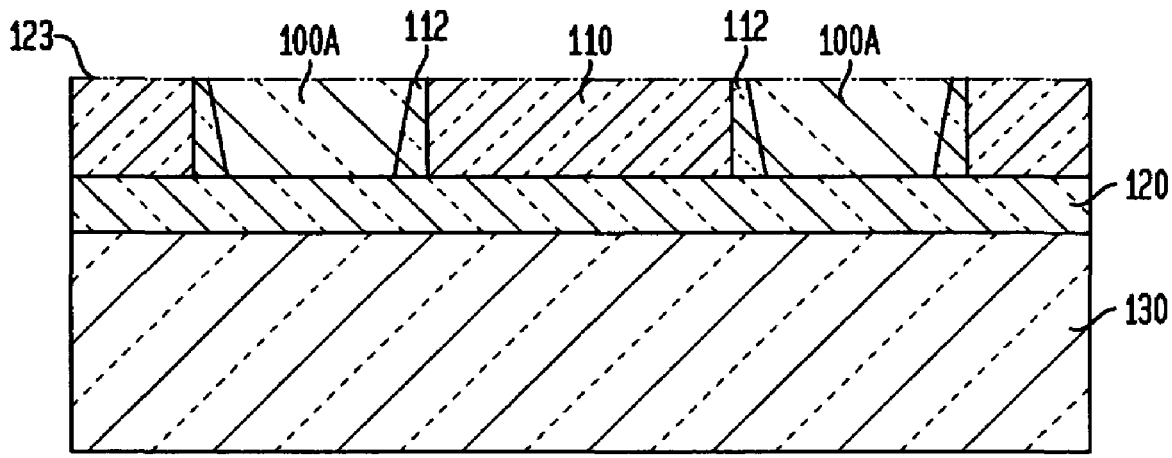

After separation and removal of the second, lower semiconductor layer 100, the entire structure, which includes the first and second surface semiconductor structures 100A and 110 and the insulator layer 120 can be flipped over, so that the insulator layer 120 is at the bottom and the first and second surface semiconductor structures 100A and 110 are on the top. A substitute semiconductor base structure 130 can then be bonded to a lower surface of the insulator layer 120, as shown in FIG. 1G, to provide structural support for the insulator layer and the first second surface semiconductor structures 100A and 110. Such a substitute semiconductor base structure 130 may comprise any suitable semiconductor material, including, but not limited to: Si, SiC, SiGe, SiGeC, Ge alloys, GaAs, InAs, InP, as well as other III-V or II-VI compound semiconductors, and it may also comprise an organic semiconductor structure, a layered semiconductor structure such as Si/SiGe, a silicon-on-insulator structure or a SiGe-on-insulator structure. The substitute semiconductor base structure 130 may be doped, undoped, or contain doped and undoped regions therein (not shown).

Although FIGS. 1F and 1G shows bonding of the substitute semiconductor base structure 130 after the second, lower semiconductor layer 100 has been removed, it is understood that the present invention also covers embodiments in which the substitute semiconductor base structure 130 is bonded to the insulator layer 120 before removal of layer 100.

FIG. 1G shows that a rough surface 123 is formed on the first and second surface semiconductor structures 100A and 110 after separation and removal of the second, lower semiconductor layer 100. Additional planarization steps can be carried out to polish the rough surface 123 and to form a complete multi-orientation SOI substrate that has a smooth upper surface 124 for subsequent fabrication of device structures thereon, as shown in FIG. 1H.

Figure 1H:
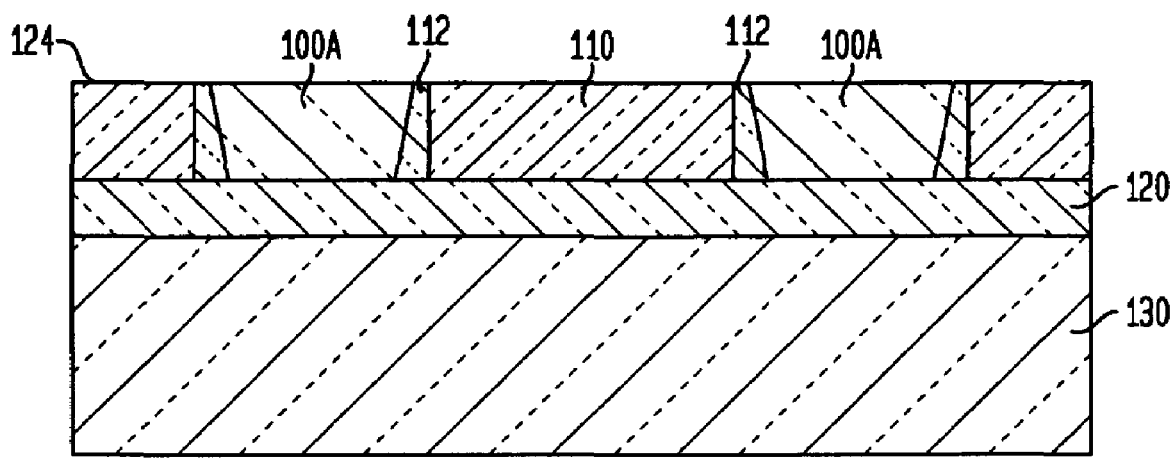

The complete multi-orientation SOI substrate illustrated by FIG. 1H contains a first surface semiconductor region 110 of a first crystal orientation and a second surface semiconductor region of a second, different crystal orientation, both of which are located directly on the common insulator layer 120 that is supported by the substitute semiconductor base structure 130.

Conventional front-end-of-line and back-end-of-line processing steps, such as shallow trench isolation, implantation, chemical vapor deposition, metal sputtering, selective etching, etc., can then be carried out on the complete multi-orientation SOI substrate to form various device structures, such as transistors, diodes, resistors, capacitors, varactors, etc.

FIGS. 2A-2F illustrate a slightly different method for forming a multi-orientation substrate with complete SOI structure, according to another embodiment of the present application.

Figure 2A:
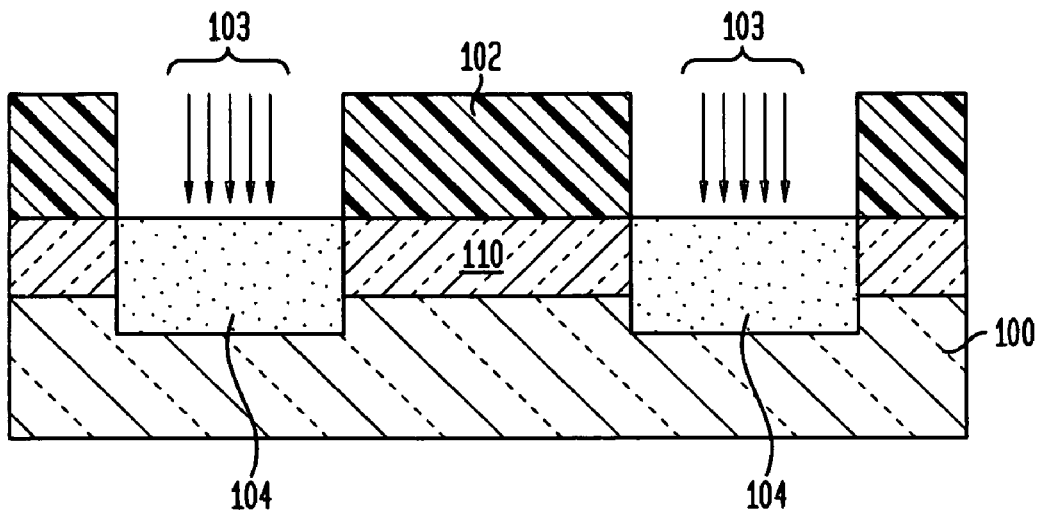
FIGS. 2A-2F show cross sectional views that illustrate the processing steps of another exemplary method for forming a multi-orientation SOI substrate structure, according to one embodiment of the present invention.

Specifically, FIG. 2A shows that a bilayer semiconductor structure that contains the first, upper semiconductor layer 110 and the second, lower semiconductor layer 100, as described hereinabove, is first provided, followed by formation of a patterned mask 102 over an upper surface of the first semiconductor layer 110. The patterned mask 102 can be readily formed by conventional photolithography and etching techniques so as to define one or more unprotected regions 104 on the surface of the first, upper semiconductor layer 110. The patterned mask allows selective or localized amorphization at the unprotected regions 104. The selective or localized amorphization process, which is typically effectuated by ion bombardment 103, disrupts the original crystal structure of layer 110 (which has the first crystal orientation) at the unprotected regions 104, as shown in FIG. 2A. After the amorphization process, the patterned mask 102 is removed utilizing a conventional resist stripping process.

Figure 2B:
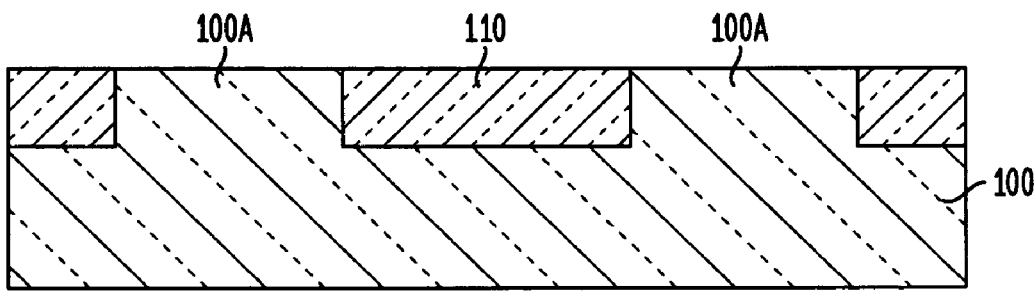

A recrystallization process is then carried out to form one or more new crystal structures that have the same crystal orientation as the second, lower semiconductor layer 100 (which has the second, different crystal orientation), as shown in FIG. 2B.

In this manner, a portion of the first, upper semiconductor layer 110 located at the unprotected regions 104 is converted from the first crystal orientation to the second, different crystal orientation, thereby forming new semiconductor structures 100A that have different crystal orientation from the remaining, unconverted portion of layer 110, as shown in FIG. 2B.

Figure 2C:
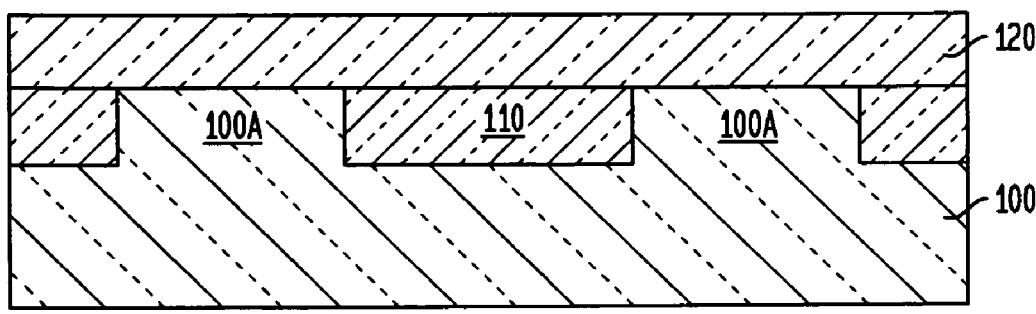
Figure 2D:
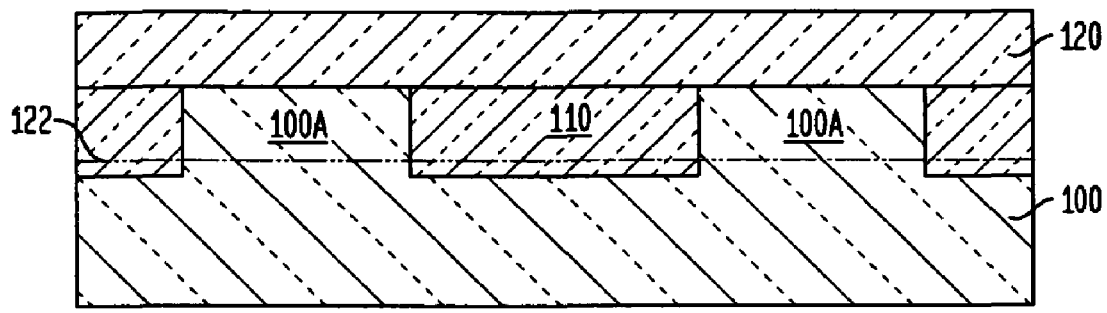
Figure 2E:
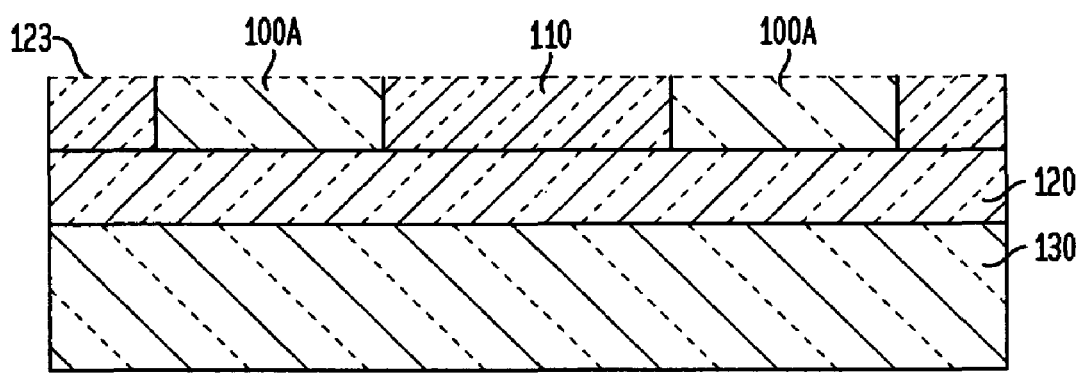
Figure 2F:
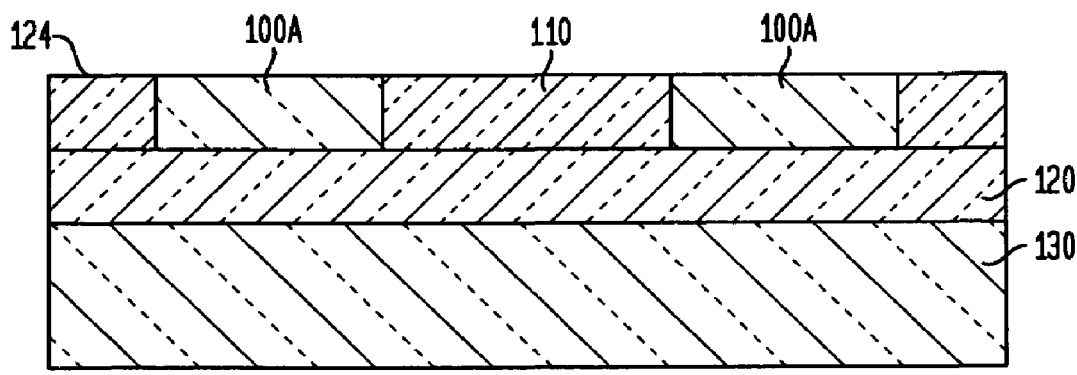

FIGS. 2C-2D shows various processing steps for forming an insulating layer 120, removing the second, lower semiconductor layer 100, providing a substitute semiconductor base structure 130, etc., similar to those described hereinabove in FIGS. 1E-1H.

Figure 3A:
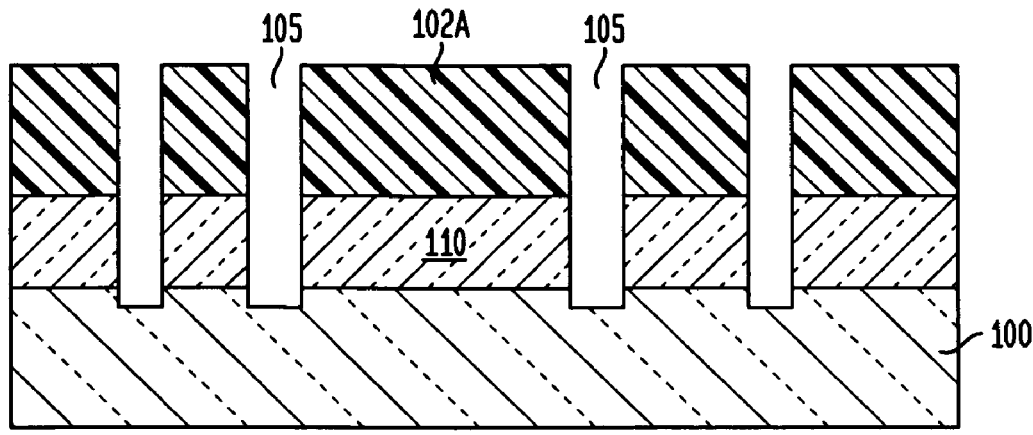
FIGS. 3A-3G show cross sectional views that illustrate the processing steps of yet another exemplary method for forming a multi-orientation SOI substrate structure, according to one embodiment of the present invention.
Figure 3B:
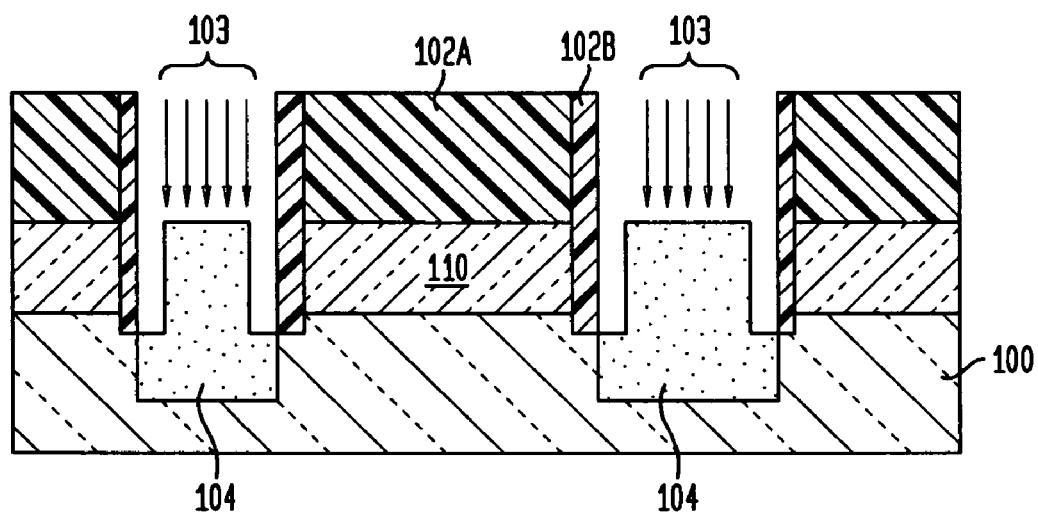

FIGS. 3A-3G illustrate yet another embodiment of the present invention for forming the multi-orientation substrate with complete SOI structure. Specifically, a bilayer semiconductor structure that contains the first, upper semiconductor layer 110 and the second, lower semiconductor layer 100 is first provided, followed by formation of a patterned mask 102A over an upper surface of the first semiconductor layer 110. The patterned mask 102A is used for trench etching to form trenches 105, which extend through the first, upper semiconductor layer 110 into the second, lower semiconductor layer 100, as shown in FIG. 3A. Subsequently, a portion of the patterned mask 102A is selectively removed to expose certain un-etched surface regions of the first, upper semiconductor layer 110. Sidewall mask 102B is then formed along sidewalls of the trenches 105. The un-removed mask 102A and the sidewall mask 102B together define one or more unprotected regions 104, which are isolated from the protected regions of layer 110 by the trenches 105. Selective or localized amorphization can then be carried out at such unprotected regions 104 utilizing ion bombardment 103 to disrupt the local crystal structure of layer 110 (which has the first crystal orientation) at such unprotected regions 104, as shown in FIG. 3B. After the amorphization process, the masks 102A and 102B are both removed utilizing conventional resist stripping steps.

Figure 3C:
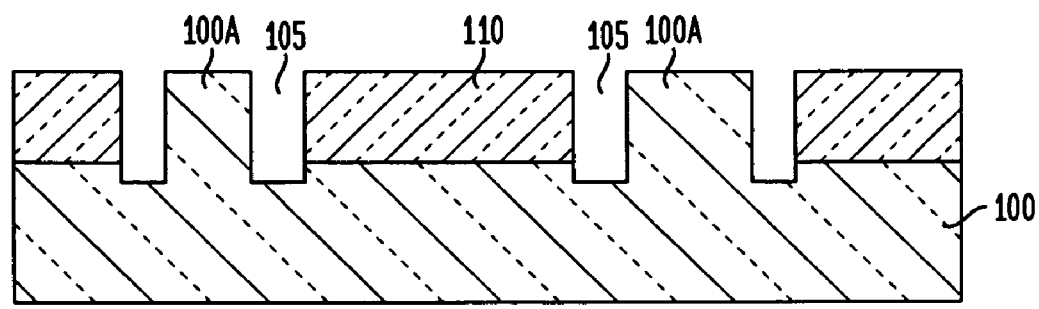

Recrystallization process is then carried out to form one or more semiconductor structures 100A at the unprotected regions 104. The semiconductor structures 100A so formed have the same crystal orientation as the second, lower semiconductor layer 100 (which has the second, different crystal orientation), which is different from the crystal orientation of the remaining portions of layer 110, as shown in FIG. 3C. In this manner, a multi-orientation bulk semiconductor structure is formed, which comprises semiconductor structures 100A and 110 of different crystal orientations located directly on the second, lower semiconductor layer 100.

Figure 3D:
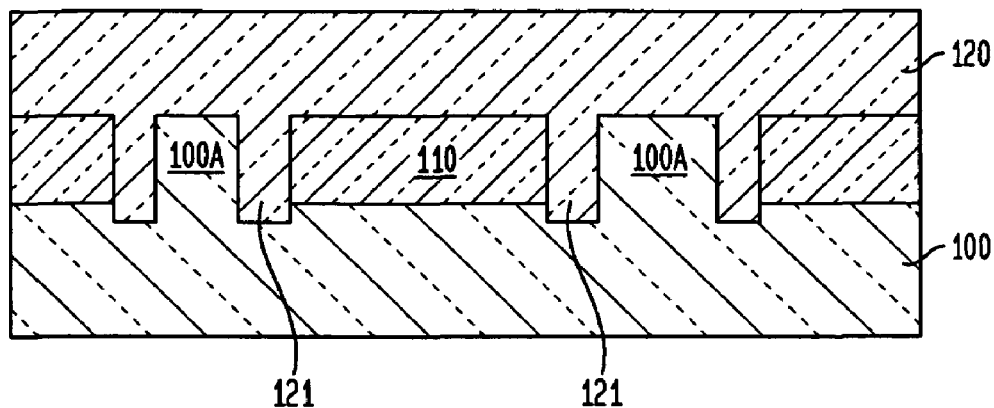
Figure 3E:
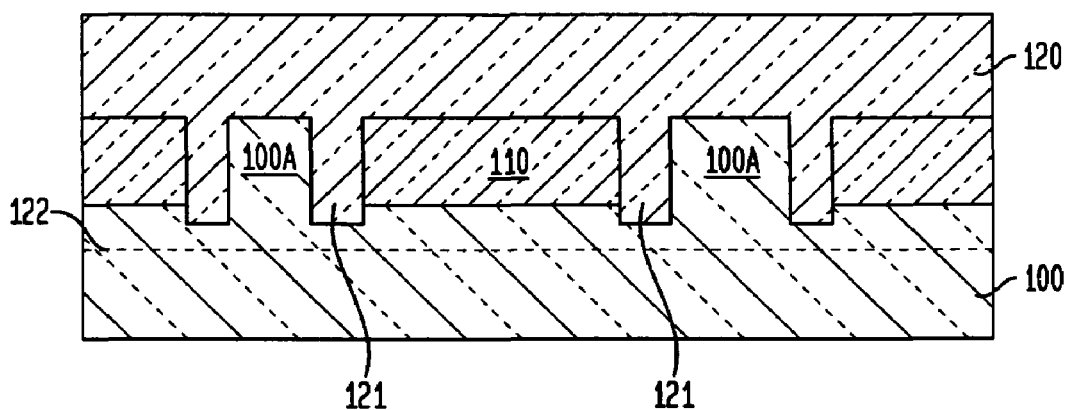
Figure 3F:
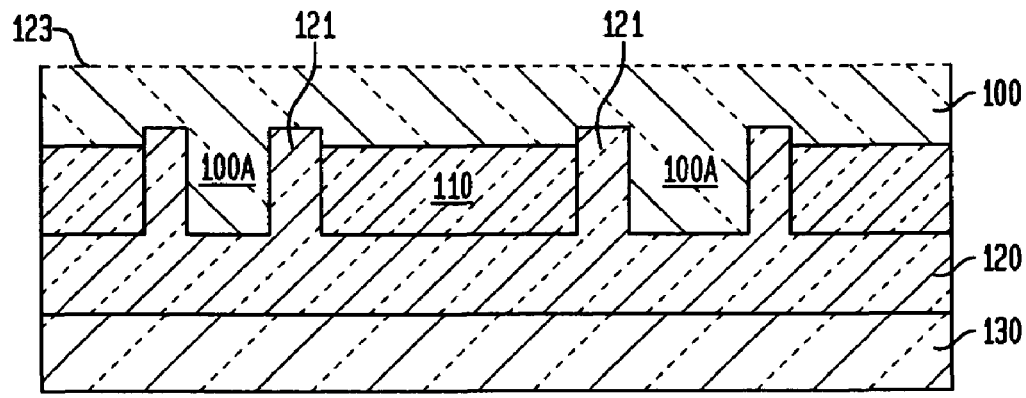
Figure 3G:
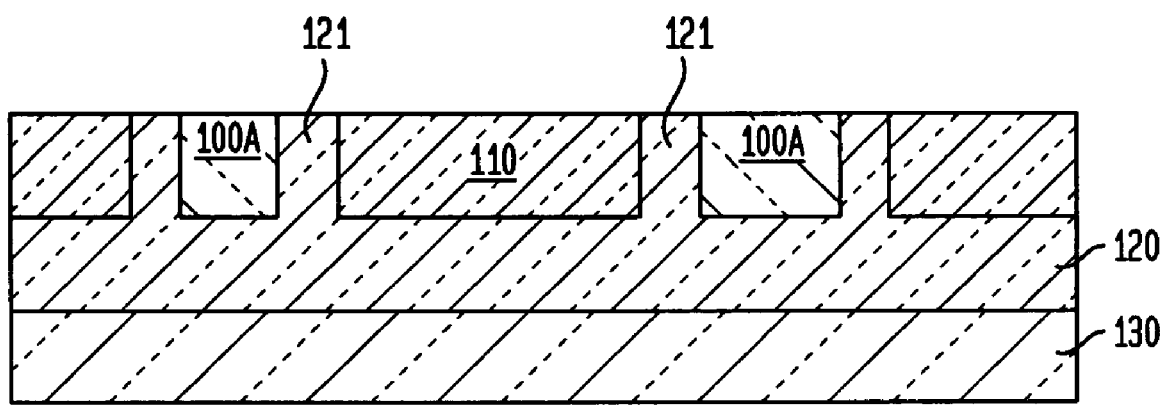

Note that the semiconductor structures 100A and 100 in FIG. 3C are isolated from each other by trenches 105. When the insulator layer 120 is formed over the semiconductor structures 100A and 100, trenches 105 are concurrently filled with insulator material(s) to form insulator structures 121, as shown in FIG. 3D. The insulator structures 121 provide isolation between semiconductor surface regions of different crystal orientations in the final SOI multi-orientation semiconductor substrate structure as shown by FIG. 3G. More importantly, such insulator structures 121 function as shallow trench isolations for device structures to be formed subsequently, and separate trench isolation processing steps are therefore no longer necessary.

While FIGS. 1A-3G illustratively demonstrate exemplary multi-orientation SOI substrate structures and exemplary processing steps for fabricating same, according to specific embodiments of the present invention, it is clear that a person ordinarily skilled in the art can readily modify the substrate structures and the process steps illustrated herein, for adaptation to specific application requirements, consistent with the above descriptions. It should therefore be recognized that the present invention is not limited to the specific embodiment illustrated hereinabove, but rather extends in utility to any other modification, variation, application, and embodiment, and accordingly all such other modifications, variations, applications, and embodiments are to be regarded as being within the spirit and scope of the invention.

What is claimed is:

1. A method for forming a multi-orientation semiconductor-on-silicon (SOI) substrate structure, comprising:
    forming a multi-orientation bulk semiconductor substrate comprising at least a first surface semiconductor region having a first crystal orientation and at least a second surface semiconductor region having a second, different crystal orientation, wherein both the first and second surface semiconductor regions are located directly on a semiconductor base layer having either the first or the second crystal orientation;
    forming an insulator layer directly over the first and second surface semiconductor regions; and
    removing the semiconductor base layer from the first and second surface semiconductor regions and the insulator layer to form a multi-orientation SOI substrate structure that comprises the first and second surface semiconductor regions located directly on the insulator layer.

2. The method of claim 1, wherein the multi-orientation bulk semiconductor substrate is formed by:
    forming a layered semiconductor structure that comprises a first, upper semiconductor layer having one of the first and the second crystal orientations and a second, lower semiconductor layer having the other of the first and the second crystal orientations;
    selectively removing a portion of the first, upper semiconductor layer to form at least one recess that expose an upper surface of the second, lower semiconductor layer;
    growing semiconductor materials in the at least one recess and over at least one un-removed portion of the first, upper semiconductor layer to form at least a first semiconductor structure that has the same crystal orientation as the second, lower semiconductor layer and at least a second semiconductor structure that has the same crystal orientation as the first, upper semiconductor layer; and
    planarizing the first and second semiconductor structures.

3. The method of claim 2, wherein the layered semiconductor structure is formed by wafer bonding.

4. The method of claim 1, wherein the multi-orientation bulk semiconductor substrate is formed by:
    forming a layered semiconductor structure that comprises a first, upper semiconductor layer having one of the first and the second crystal orientations and a second, lower semiconductor layer having the other of the first and the second crystal orientations; and
    selectively converting a portion of the first, upper semiconductor layer to form at least a first semiconductor structure that has the same crystal orientation as the second, lower semiconductor layer, wherein at least one unconverted portion of the first, upper semiconductor layer form at least a second semiconductor structure that has the same crystal orientation as the first, upper semiconductor layer.

5. The method of claim 4, wherein the layered semiconductor structure is formed by wafer bonding.

6. The method of claim 4, wherein trenches that extend through the first, upper semiconductor layer into the second, lower semiconductor layer are formed before the selective conversion, and wherein the first semiconductor structure is isolated from the second semiconductor structure by said trenches after the selective conversion.

7. The method of claim 4, wherein the selective conversion is carried out by selective amorphization and recrystallization.

8. The method of claim 1, wherein the insulator layer comprises a thermally grown insulator material selected from the group consisting of silicon oxides, silicon nitrides, and silicon oxynitrides.

9. The method of claim 1, wherein the semiconductor base layer is removed from the first and second surface semiconductor regions by:
 implanting at least one defect-inducing agent near an interface between the semiconductor base layer and the first and second surface semiconductor regions to form a zone weakened by the presence of defects; and
 splitting in the weakened zone so as to detach the semiconductor base layer from the first and second surface semiconductor regions and the insulator layer.

10. The method of claim 9, wherein the defect-inducing agent comprises hydrogen.

11. The method of claim 10, wherein hydrogen is implanted at a dose of not less than $1 \times 10^{16}$ atoms/cm$^2$.

12. The method of claim 1, further comprising bonding a substitute semiconductor base structure to a surface of the insulator layer opposite to the surface that contacts the first and second surface semiconductor regions, either before or after removal of the semiconductor base layer.

13. The method of claim 1, further comprising planarizing the first and second surface regions after removal of the semiconductor base layer.

14. The method of claim 1, wherein the first and second surface semiconductor regions comprise semiconductor material(s) selected from the group consisting of Si, SiC, SiGe, SiGeC, Ge alloys, GaAs, InAs, InP, III-V compound semiconductors, and II-VI compound semiconductors.

15. The method of claim 1, wherein the first and second surface semiconductor regions comprise silicon, and wherein the first and second crystal orientations are selected from the group consisting of (100), (111), and (110).

16. A method comprising growing an insulator layer directly on a multi-orientation bulk semiconductor substrate that comprises surface semiconductor regions of different crystal orientations located directly on a semiconductor base layer, and removing the semiconductor base layer, thereby forming a multi-orientation SOI substrate structure that comprises surface semiconductor regions of different crystal orientations located directly on the insulator layer.

* * * * *